United States Patent [19]

Takagi

[11] Patent Number: 4,701,701
[45] Date of Patent: Oct. 20, 1987

[54] APPARATUS FOR MEASURING CHARACTERISTICS OF CIRCUIT ELEMENTS

[75] Inventor: Susumu Takagi, Hachioji, Japan

[73] Assignee: Hewlett-Packard Company, Palo Alto, Calif.

[21] Appl. No.: 887,675

[22] Filed: Jul. 18, 1986

[30] Foreign Application Priority Data

Jul. 19, 1985 [JP] Japan .................................. 60-159538
Aug. 2, 1985 [JP] Japan .................................. 60-170930
Aug. 2, 1985 [JP] Japan .................................. 60-170931

[51] Int. Cl.[4] ...................... G01R 31/26; G01R 17/02
[52] U.S. Cl. ............................. 324/158 R; 324/73 R; 324/158 T; 364/579; 364/580
[58] Field of Search ............ 324/73 R, 158 T, 158 R; 364/481, 483, 579, 580; 323/901, 280; 363/49

[56] References Cited

U.S. PATENT DOCUMENTS 3,988,672 10/1976 Cowart ............................ 324/158 T
4,517,512 5/1985 Petrich et al. .................... 324/73 R

OTHER PUBLICATIONS

Hewlett-Packard Journal, Takagi et al., "Programmable Stimulus/Measurement Units Simplify Device Test Setups", Oct. 1982, pp. 15–20.

Primary Examiner—Gerard R. Strecker
Assistant Examiner—Stephen M. Baker
Attorney, Agent, or Firm—James M. Williams

[57] ABSTRACT

An instrument for measuring the characteristics of a circuit element has a plurality of SMUs for applying test signals to the terminals of the circuit element and measuring the resulting output signals. A control circuit compares the output signal value to a reference value while varying the test signals. The test signal is varied by an integrator which operates in two modes, a search mode with no feedback to quickly bring the output signal to the approximate value of the reference, and a feedback mode to hold the output signal at the reference value while a measurement is made. The parameters for setting stable operating conditions for the feedback loop with the circuit element being tested are stored in a memory of the control circuit.

4 Claims, 4 Drawing Figures

APPARATUS FOR MEASURING CHARACTERISTICS OF CIRCUIT ELEMENTS

BACKGROUND AND SUMMARY OF THE INVENTION

The present invention relates generally to apparatus for measuring characteristics of a circuit element such as a transistor, a field effect transistor (FET), etc., and in particular to apparatus for measuring interdependent characteristics of such a circuit element, such as the threshold voltage of an FET.

Conventionally, devices called SMUs have been used to measure parameters of the samples of a semiconductor, such as a transistor, a field effect transistor (refer to Japanse Patent: Tokkaisho 58-148506). An SMU is capable of supplying a regulated DC voltage to a sample while measuring the DC current supplied to the sample, or supplying a regulated DC current to a sample while measuring the voltage applied to the sample. In cases where the characteristics of the semiconductor sample can be measured by using a conventional measuring appratus including a plurality of SMUs which are independent from each other, the set up and measurement can be effectively carried out in one step with the SMUs thereafter operating independently from one another.

However, there are some cases in which the characteristics cannot be measured with independent SMUs. Measuring the DC current amplification factor $h_{FE}$ of a transistor, or the threshold voltage $V_{TH}$ of an FET requires a coodinated operation of multiple SMUs. To make the $V_{TH}$ measurement, the voltage applied by the SMU connected to the gate terminal of the FET must be varied until the voltage and the current measured by the SMU connected to the drain terminal of the FET are at the predetermined values at which the $V_{TH}$ measurement is to be made.

One prior art method for measuring characteristics involving interdependent circuit parameters is shown in FIG. 4. The measurement circuit in FIG. 4 comprises SMU 401, a summing amplifier 402, an integrator 403, and a sample FET 404 connected to form an analog feedback loop circuit. In FIG. 4, the loop is operated such that a difference signal $e_o$ between a voltage signal $V_M$ representing the drain current $I_D$ and a reference voltage signal $V_{MREF}$ is integrated by the integrator 403 to produce a negative feedback signal to the gate of the FET 404. Accordingly, the loop converges to make $V_M = V_{MREF}$, the threshold voltage $V_{TH}$ can be measured at a predetermined drain current value if the signal $V_{MREF}$ is set to the proper value $V_M$ which corresponds to the drain current $I_D$ at which the measurement is to be made.

In order to assure the stability of the negative feedback loop, however, it is necessary to make the integration constant $T_k$ of the integrator 403 sufficiently large so that the total gain becomes lower than 1 at frequencies in which phase delays, comprised of the response delay of the FET 404, the delay in conversion of the drain current into an output voltage of the SMU 401 and the like exceed 90 degrees. If the integration constant $T_k$ is set smaller, positive feedback may be produced, causing the loop circuit to oscillate making measurement impossible. This requirement limits the slew rate for the gate voltage, and consequently limits the search rate. Typical search rates are on the order of 100 ms/V. Another disadvantage of this method is that the operator needs a high degree of knowledge about setting the measuring conditions in accordance with characteristics of a sample to make a proper measurement. The result is that the operation of the measurement instrument becomes extremely complicated.

An object of the present invention is to provide an apparatus for measuring characteristics of a circuit element using a plurality of SMUs in coordination, and setting the measurement conditions using a two mode technique with a fast search mode followed by an analog feedback mode, to make it possible to perform highly stabilized measurements at a high speed and to eliminate successive changes in setting in the measuring conditions.

The circuit element characteristics measuring apparatus of the preferred embodiment of the present invention applies a test input signal from each of a plurality of SMUs to the terminals of a circuit element under test and measures an output signal produced by the circuit element which is a function of one or more of the input signals. The SMUs are supplied with initial values of the applied signals on the basis of the measuring conditions and known characteristics of the circuit element to be measured. Then, a two mode approximation procedure is used with a fast search mode to make the dependent measured signal approximately equal to a reference value, followed by a feedback mode to stabilize the dependent measured signal at the reference value while the measurement is made. In the search mode, one of the applied signals is rapidly changed in one direction while monitoring the dependent measured signal. Because no feedback loop is involved, a very fast slew rate can be used, on the order of 2 ms/V. Then, in the feedback mode, a negative feedback loop is switched in to superimpose the integrated difference between the output signal and the reference value on the signal applied by the SMU to make the output signal coincide with the reference value.

Accordingly, the signal values applied by the SMUs need to be set only once for each type of device tested, so that high speed set up and testing can be achieved.

Further, the measurement can be made very quickly because of the fast response of the search mode. The negative feedback loop can be set with parameters calculated in advance at a relatively conservative response, so it never becomes unstable, without appreciably affecting the speed of the measurement.

DETAILED DESCRIPTION OF THE INVENTION

Figure 1:
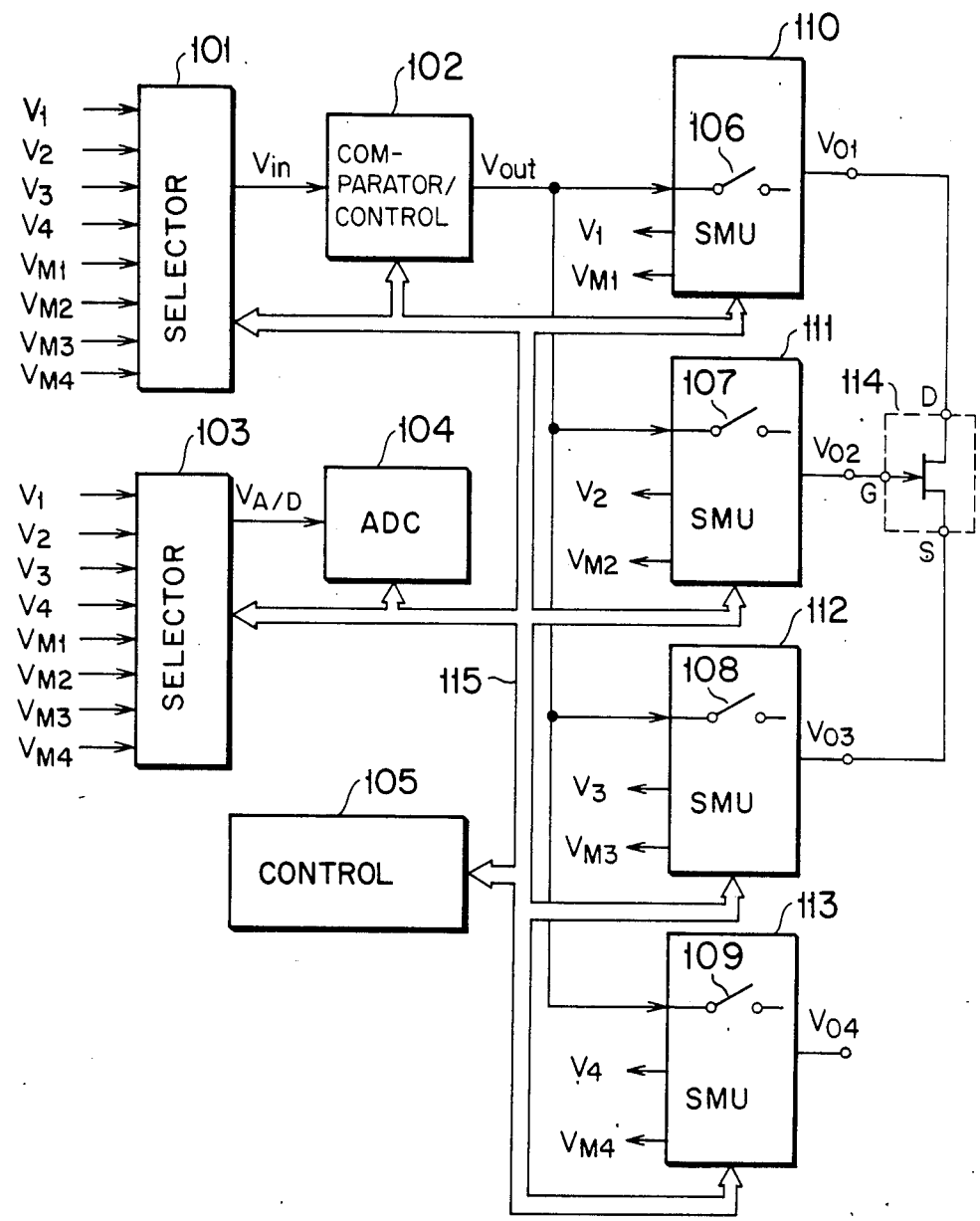
FIG. 1 is a block diagram showing the preferred embodiment of the apparatus for measuring characteristics of a circuit element constructed according to the present invention.

FIG. 1 is a block diagram showing the preferred embodiment of the apparatus for measuring characteristics of a circuit element constructed according to the present invention.

In FIG. 1, a control circuit 105 provided with a memory device controls the internal switching operations of selection circuits 101 and 103, a comparator/control circuit 102, an analog-to-digital converter (ADC) 104, the settings and operating mode of SMUs 110-113, and switches 106-109, through a bus 115. Control circuit 105 sets the oeprating conditions of these components in accordance with stabilizing conditions previously stored in the memory device and/or in response to externally supplied measuring conditions.

The selection circuit 101 selectively applies one of voltage signals $V_1$-$V_4$ representing output voltages of the SMUs 110-113, or voltage signals $V_{M1}$-$V_{M4}$ representing output currents of the same SMUs, to the comparator/control circuit 102 as input signal $V_{in}$.

Figure 3:
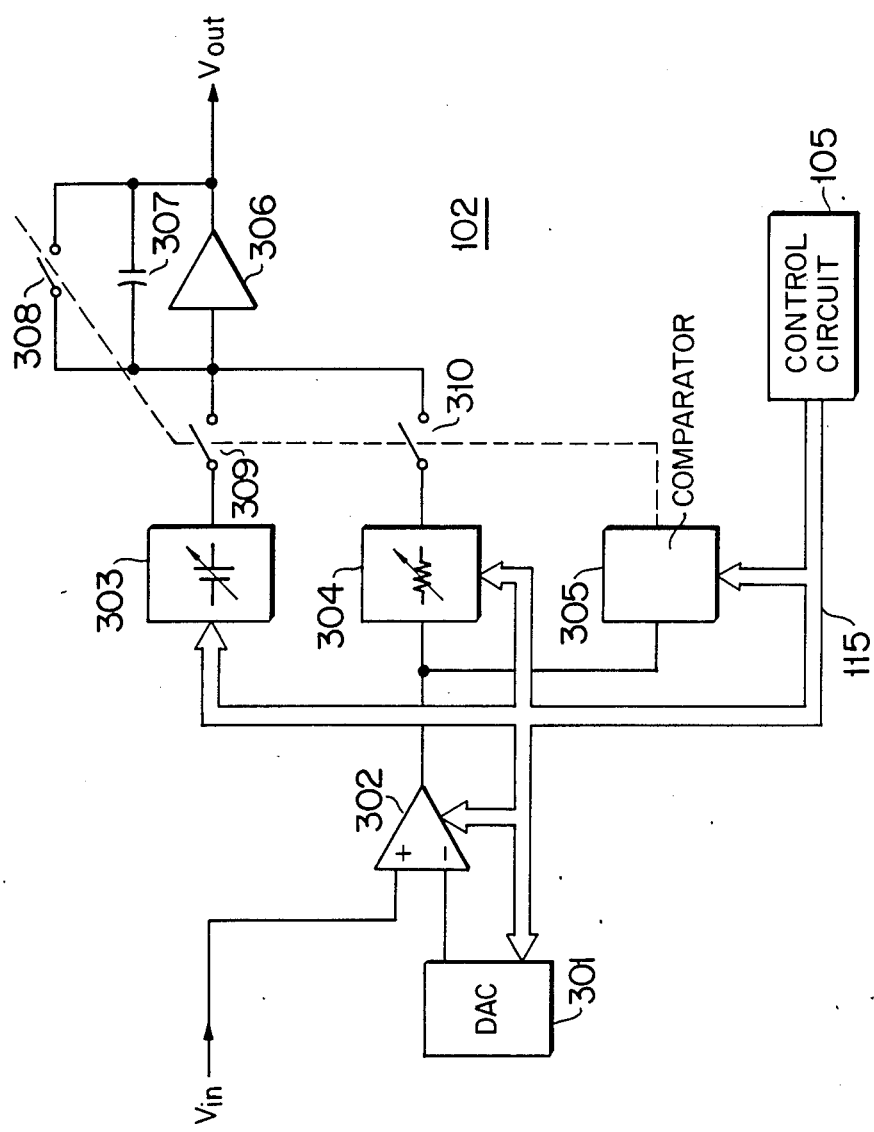
FIG. 3 is a more detailed schematic block diagram of the comparator/control circuit 102, shown in FIG. 1.
Figure 4:
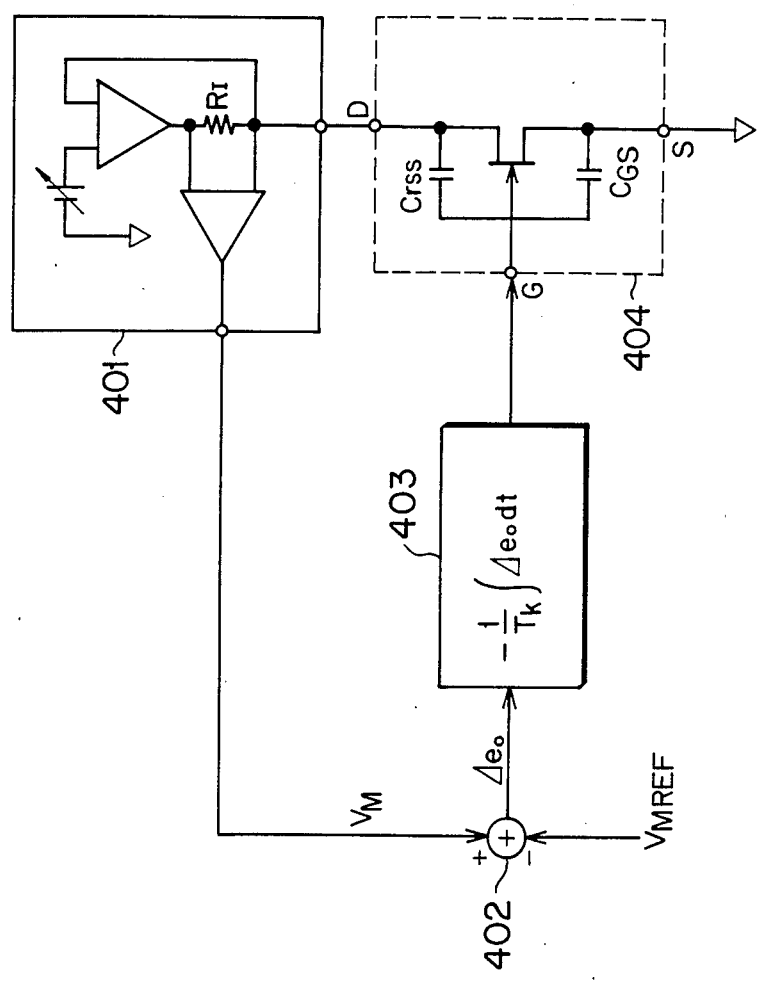
FIG. 4 is a block diagram illustrating apparatus and a method used in the prior art for measuring characteristics involving interdependent circuit parameters.

The comparator/control circuit 102 comprises an integrating amplifier 306, a variable DC current source 303, an error amplifier 302, a comparator 305, and other components as shown in FIG. 3. The variable DC source 303 is used as a test signal source and the signal $V_{in}$ is compared with a reference signal voltage in the search operation mode of the comparator/control circuit 102 as described later. When the result of the comparison satisfies a predetermined condition, comparator/control circuit 102 enters a feedback mode in which an error signal derived from $V_{in}$ is fed back to a selected one of the SMUs 110-113.

In the preferred embodiment shown, the SMUs 110-112 supply test signals to the respective terminals of drain D, gate G, and source S of a sample FET 114. SMUs 110-112 are controlled by a signal from the control circuit 105. The signal $V_{out}$ from the comparator/control circuit 102 is also applied to selective terminals of the sample FET through switches 106, 107, 108 and 109 from the control circuit 105. In the example shown in FIG. 1, the SMU 113 is not connected with the FET 114, but illustrates that the invention may be applied to systems with additional SMUs.

The selection circuit 103 selects the signal representing the circuit element characteristic to be measured from the signals $V_1$-$V_4$ or $V_{M1}$-$V_{M4}$ produced from the SMUs 110 to 113 and applies the selected signal to the ADC 104 as a signal $V_{A/D}$. The ADC 104 converts the signal $V_{A/D}$ into a digital signal which is in turn applied to a display device (not shown) to display the measured characteristic.

Figure 2:
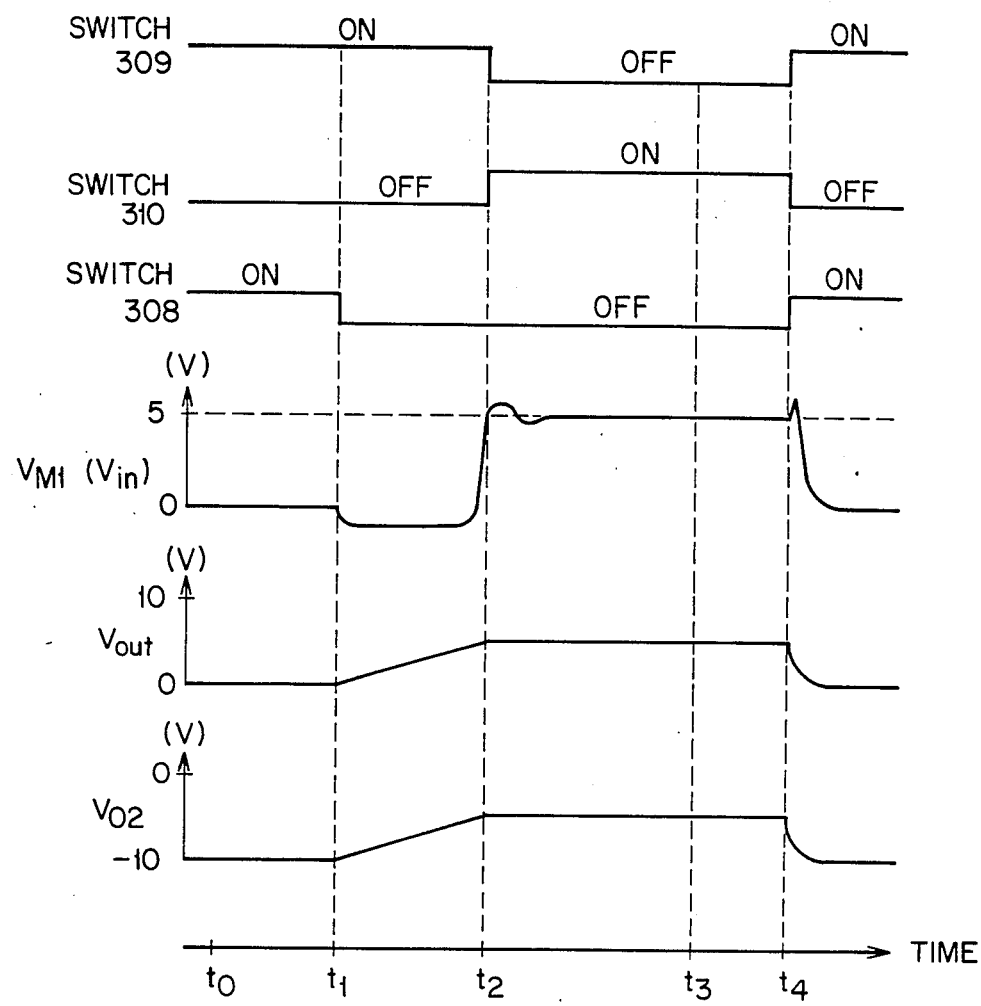
FIG. 2 is a timing diagram illustrating the operation of the apparatus shown in FIG. 1.

FIG. 2 is a timing diagram illustrating the operation of the circuit element characteristics measuring apparatus shown in FIG. 1.

FIG. 3 is a more detailed schematic block diagram of the comparator/control circuit 102. An error amplifier 302 produces an error signal proportional to the difference between the signal $V_{in}$ and a reference signal produced by a D/A converter (DAC) 301. The error signal is applied to a variable resistor 304 and a comparator 305. The variable resistor 304 can be a conventional resistor or a multiplying DAC. The value of the variable resistor 304 and switching of the polarity of the error signal thereto are set by control signals from the control circuit 105 over the bus 115. The comparator 305 opens switch 309 and closes switch 310 when the error signal crosses zero potential. The setting of the direction of the output signal of the error amplifier 305, that is, whether the output signal is directed from a positive value to a negative on or from a negative value to a positive one when it crosses the zero potential, is made by the control circuit 105 through the bus 115.

The output signal of a variable DC source 303 is controlled by the control circuit 105 through the bus 115 and applied to an amplifier 306 through the switch 309. The output from the variable resistor 304 is applied to the amplifier 306 through the switch 310. The amplifier 306, a capacitor 307, the variable DC source 303, and the variable resistor 304 constitute the integrator. The output of the integrator is the signal $V_{out}$.

The operation of the invention can be more easily understood using the following example, in which the threshold voltage $V_{TH}$ of an FET is measured under conditions in which a voltage across the drain and the source is 10 V and the drain current is 1 nA. Assuming that the expected value of the $V_{TH}$ is within a range from $-10$ V to 0 V, the initial conditions, at time $t_0$, can be set by control circuit 105 as follows.

The selection circuit 101 is set to apply voltage signal $V_{M1}$, which is proportional to the output current of the SMU 110, the drain current, to the comparator/control circuit 102 as the input signal $V_{in}$.

The selection circuit 103 is set to apply voltage $V_2$, which is proportional to the gate voltage of the FET 114, to the ADC 104 as the input signal $V_{A/D}$.

The SMU 110 is set to have an output voltage of 10 V and an output current of 2 nA, the SMU 111 is set to have an output voltage of $-10$ V and an output current 1 uA, and the SMU 112 is set to have an output voltage 0 V and an output current of 1 mA. The comparator/control circuit 102 is set to produce a ramped output voltage $V_{out}$ within a range from 0 to 10 V and DAC 301 is set to produce a comparison reference voltage of 5 V (it is assumed that the signal $V_{M1}$ is 5 V when the drain current is 1 nA), the search speed is set to be 10 V/m sec., and an integration constant of the integrator is set to be 10 m sec.

The switches 106 and 108 are set to be open and the switch 107 is set to be closed. In the initial state at the beginning of a measurement, at time $t_0$, switch 308 and switch 309 are closed and switch 310 is open.

At the time $t_1$, the switch 308 is turned off by control circuit 105, placing comparator/control circuit 102 in the search mode. In this mode, the variable DC source 303 produces a ramp current, increasing at a rate determined by the search speed, applied to the amplifier 306. Because it does not affect the stability of any feedback loop, the search speed can be made extremely high. The current is integrated by the amplifier 306 and the capacitor 307 to produce the signal $V_{out}$. The signal $V_{out}$ is applied through switch 107, so voltage $V_{02}$ at the terminal of SMU 111 connected to the gate of the FET slowly increases from $-10$ V in response to the signal $V_{out}$.

As $V_{out}$ ramps up, the error amplifier 302 produces an error signal in proportion to the difference between the signal $V_{in}$ and the reference output signal of the DAC 301 (5 V in this example). When the signal $V_{out}$ brings $V_{02}$ up to the threshold voltage $V_{TH}$, the signal $V_{M1}$, that is, the signal $V_{in}$, rises rapidly to the value of the reference voltage from the DAC 301.

At the time $t_2$, the comparator/control circuit 102 detects the fact that the signal $V_{M1}$ reaches the comparison reference voltage, 5 V (that is, the drain current reaches 1 nA), turns the switch 309 off and the switch 310 on. This stops the search operation by disconnecting the variable DC source 303, and switches the comparator/control circuit 102 into the analog feedback mode. In this mode, the output signal of the error amplifier 302 is integrated with a predetermined integration constant by the integrator comprised of the variable resistor 304, the amplifier 306, and the capacitor 307, to produce the signal $V_{out}$. The comparator/control circuit 102 begins to integrate the error signal, the difference between the signal $V_{in}$ and the reference voltage (5 V) and apply the integrated value to the SMU 111 as the signal $V_{out}$.

As a result, even if an error is generated by a delay or the like in operating switches 309 and 310, the output signal $V_{in}$ is stably maintained at the reference value (5 V), with the desired 1 nA drain current flowing in the FET 114, and the signal $V_2$ corresponds to the threshold voltage $V_{TH}$ of the FET 114. With the proper conditions stably maintained, the threshold voltage can be measured and displayed by selecting the $V_2$ output of SMU 111, and the corresponding gate current can be measured and displayed by selecting the $V_{M2}$ output of SMU 111.

At time $t_3$, the ADC 104 A/D converts the signal $V_2$ corresponding to the threshold voltage $V_{TH}$ of the FET 114 for display or storage. Concurrently, the gate current value can also be obtained by selecting the signal $V_{M2}$ for A/D conversion and display.

At time $t_4$, the control circuit 105 resets the comparator/control circuit 102 to finish the measurement, returning the switches 308, 309, and 310 to their initial state so that another measurement can be initiated.

The operating parameters for establishing stable operation of the measuring apparatus are determined from relationships stored in control circuit 105 and from input information entered by the operator concerning the measurement to be made.

The integration constant of the integrator must be large enough to avoid oscillation when the feedback signal is delayed. This can be done by taking into account the effects of the delay factors and compensating factors of the components of the measurement instrument and the delay factors of the device being measured. Control circuit 105 sets the integration constant according to the following two equations:

$$T_k >> jw\ R_I(T_M + T_{Di} - T_{Ai})$$

$$T_k > C_{rss} R_I$$

where,
$T_k$ = integration constant;
$R_I$ = the resistance value in the SMU measurement circuit;
$T_M$ = the delay in the response of the FET;
$T_{Di}$ = the delays for the components of the instrument;
$T_{Ai}$ = the compensating factors for components of the instrument;
$C_{rss}$ = the gate to drain capacitance of the FET;

The voltage range of the SMU connected to the drain of the FET must include the lowest voltage in the range of threshold voltages. Otherwise, the measurement can be missed altogether and a large current flow could result, damaging the FET. The control circuit 105 sets the initial conditions of the SMUs based on the expected range of threshold values entered by the operator.

The current range of the SMUs is set to a sensitivity as low as possible so long as the designated allowable measuring error can be achieved. The search speed can be selected independently, but it places constraints on other variables, in particular the current limits of the SMUs. In the case of an overshoot on applied gate voltage, an excess drain current can result and must be limited to prevent a drop in the SMU output voltage. In the case of a positive feedback current of the opposite polarity, it is necessary to prevent a rise in the SMU voltage. Similarly, it is necessary to limit the current flowing into the gate of the FET so it does not exceed the detection range of the SMU. The control circuit 105 sets the limits on the SMU currents according to the following three equations:

$$I_{L1}/I_{DO} > \exp(qT_c SR/mkT)$$

$$I_{L1} > C_{rss} SR$$

$$I_{L2} > (C_{rss} + C_{GS}) SR$$

where
$I_{L1}$ = the current limit for the SMU connected to the drain of the FET;
$I_{L2}$ = the current limit for the SMU connected to the gate of the FET;
$I_{DO}$ = the initial drain current setting;
SR = the search rate (V/sec);
$T_c$ = the delay in stopping the search mode;
$C_{rss}$ = the gate to drain capacitance of the FET;
$C_{GS}$ = the gate to source capacitance of the FET.

The time at which the measurement is taken, $t_3$, must be set at a point after the search is completed and the measurement conditions have stabilized. The delay from $t_1$ is the sum of the search time and the settling time. The search time is (the range of $V_{TH}$)/SR. The settling time is the larger of the two following two expressions:

$$P_1[(T_K + T_M' - C_{rss} R_I)/ AR_I]$$

$$P_2 T_M$$

where
$T_M'$ = a factor based on the current range used for detection feedback;
A = the rate at which the drain current changes in proportion to changes in the gate voltage;
$P_1, P_2$ = scaling constants chosen to insure that stability has been reached.

It will be understood that the search time can be shortened by starting the search as close as possible to the threshold value, without exceeding the threshold value.

Although the embodiment described operates in response to analog signals, the instrument control system could also be implemented with a completely digital system.

I claim:

1. Apparatus for measuring characteristics of a circuit element, comprising:
an SMU capable of producing an output voltage at a first output terminal connected to the circuit element under test, measuring the current flowing through the first output terminal, and producing a measurement signal at a second output terminal proportional to the measured current, or producing an output current at a first output terminal connected to the circuit element under test, measuring the voltage appearing at the first output terminal, and producing a measurement signal at a second output terminal porportional the the measured voltage;

means responsive to the measurement signal and to a reference value, for producing an error signal representing the difference between the measurement signal and the reference value;

a comparator responsive to the error signal to operate an integrator in two modes, in the first mode providing a varying output voltage or current to the first output terminal of the SMU until the error signal reaches zero for the first time, and thereafter entering the second mode, integrating the error signal to provide a negative feedback signal to the first output of the SMU to maintain the measurement signal at the reference value; and a control circuit for controlling the SMU, the comparator and the integrator and for setting the reference value.

2. The apparatus of claim 1, wherein the control circuit comprises a memory for storing known parameters of the circuit element under test and means for deriving from the stored parameters the values for the initial output setting for the SMU, the reference value, the function for varying the integrator output in the first operating mode, and the summing weight and integration constant for the integrator in the second operating mode.

3. The apparatus of claim 1, comprising a plurality of SMUs connected to the terminals of the circuit element under test, having one SMU for producing a voltage or current applied to a first terminal of the circuit element under test;

a second SMU for measuring the current flowing through the second terminal or the voltage appearing at the second terminal and producing a second measurement signal proportional to the current or voltage measured at the second terminal.

4. The apparatus of claim 4, further comprising means for displaying the second measurement signal.

* * * * *